(12) United States Patent
Heide

(10) Patent No.: US 7,279,642 B2
(45) Date of Patent: Oct. 9, 2007

(54) COMPONENT WITH ULTRA-HIGH FREQUENCY CONNECTIONS IN A SUBSTRATE

(75) Inventor: Patric Heide, Vaterstetten (DE)

(73) Assignee: EPCOS AG, Munich (DE)

( * ) Notice: Subject to any disclaimer, the term of this patent is extended or adjusted under 35 U.S.C. 154(b) by 9 days.

(21) Appl. No.: 10/541,912

(22) PCT Filed: Dec. 16, 2003

(86) PCT No.: PCT/EP03/14348

§ 371 (c)(1),
(2), (4) Date: Aug. 9, 2005

(87) PCT Pub. No.: WO2004/064158

PCT Pub. Date: Jul. 29, 2004

(65) Prior Publication Data

US 2006/0102374 A1    May 18, 2006

(30) Foreign Application Priority Data

Jan. 13, 2003    (DE) .............................. 103 00 956

(51) Int. Cl.
*H05K 1/03* (2006.01)
(52) U.S. Cl. ..................... 174/255; 174/260
(58) Field of Classification Search ............... 257/687, 257/678; 174/255, 260
See application file for complete search history.

(56) References Cited

U.S. PATENT DOCUMENTS

| 4,739,448 | A | 4/1988 | Rowe et al. |
|---|---|---|---|
| 5,714,801 | A | 2/1998 | Yano et al. |
| 6,127,038 | A * | 10/2000 | McCullough et al. ....... 428/416 |
| 6,215,377 | B1 | 4/2001 | Douriet |
| 6,384,344 | B1 | 5/2002 | Asai et al. |
| 2002/0166689 | A1 | 11/2002 | Maetani |
| 2004/0000425 | A1* | 1/2004 | White et al. ................. 174/250 |

FOREIGN PATENT DOCUMENTS

| EP | 1 202 377 | 5/2002 |
|---|---|---|
| JP | 11 017490 | 1/1999 |

OTHER PUBLICATIONS

Edward Pillai, "40Gbit/s 'Fish Ladder' Signal Path and Connectorized Signal Path in Ceramic and Organic Packages for OC76 Applications" 2002 IEEE, pp. 239-242.

* cited by examiner

*Primary Examiner*—Hung V. Ngo
(74) *Attorney, Agent, or Firm*—Fish & Richardson P.C.

(57) ABSTRACT

The present invention relates to contacting technology for signal connections in the substrate of an extremely high frequency module, in particular a microwave or millimeter wave module. The extremely high frequency module contains a) a multilayer substrate having at least two dielectric layers and metallization layers and inter-layer connections, and b) chips positioned on the top of the multilayer substrate. The chips are electrically connected to each other and to the structures in the metallization layers by means of HF connections. The HF connection is realized by means of at least two conductor lines, which exhibit fanning. The present invention allows for simple contacting of chips having small intervals between the external contacts on the multilayer substrate.

22 Claims, 2 Drawing Sheets

COMPONENT WITH ULTRA-HIGH FREQUENCY CONNECTIONS IN A SUBSTRATE

TECHNICAL FIELD

The present invention relates to contacting technology for signal connections in the substrate of an extremely high frequency module, for example a microwave or millimeter wave module, and a contacting technology for such components.

BACKGROUND

The frequency range between 1 GHz and 30 GHz is called the microwave range (MW range). The frequency range from 30 GHz upward is called the millimeter wave range (mmw range). Extremely high frequency modules differ from high frequency modules in particular in the fact that for extremely high frequency circuits at 5 GHz and higher as a rule "waveguides," e.g., microstrip lines and coplanar lines, are used.

Extremely high frequency modules are electronic components which fulfill a variety of functionalities for applications intended for use in the frequency range from 1 to 100 GHz. Such components may be employed in general in data transmission systems, e.g., for satellite television reception, for wireless local data networks—LANs (local area networks), WLANs (wireless LANs), Bluetooth, optical modules such as multiplexers, modulators and transceiver units—as well as for radar and for front-end modules for broadband communication, e.g., LMDS (local multimedia distribution systems) and directional radio equipment for base stations.

Most modules that operate in the millimeter wave range are produced today on the basis of thin film substrates containing integrated circuits. The thin film substrate can carry one or more chip components at the same time. The chip components are attached to the carrier substrate by means of wire bonding or the flip-chip technique and are connected to it electronically. The contact paths between the chip components and the substrate are kept as short as possible, so that the signal losses, which come to light in particular when a component containing open signal—carrying lines is encapsulated with a casting compound, may be minimized.

Because of relatively high costs, the chip area of the semiconductor chip components is kept very small, which results in correspondingly small dimensions of the external contacts of such components. The contact size of a microwave IC is usually around 50 to 100 μm; the interval between the external contacts varies between 100 and 250 μm. For technological reasons, the minimum spacing between two inter-layer connections in the substrate for example is 225 μm. In principle it is possible to bring the interval of the external contacts of a microwave IC to the minimum interval between the inter-layer connections. This involves an unwanted enlargement of the chip area, however. Another problem is that for technological reasons it is not possible to apply conductor lines of any desired fineness in the substrate or on the top surface of the substrate.

SUMMARY

The object of the present invention is to improve the contacting technique between modular components in a microwave or millimeter wave module, in order to enable contacting of the semiconductor chip components, which have small intervals between their external contacts, with the metal structures in the module substrate, while maintaining the requisite minimum interval between the inter-layer connections in the module substrate.

This problem is solved according to the invention by a component having the characteristics of claim 1. Advantageous forms of the invention are evident from additional claims.

The invention specifies a component having contacting, which includes a multilayer substrate and at least one chip positioned on the top of the multilayer substrate, having at least two external contacts on the bottom which are electrically connected to the multilayer substrate. The multilayer substrate has at least two dielectric layers, one positioned directly above the other, there being metallization layers provided on top of, beneath and between the dielectric layers. In each dielectric layer at least two inter-layer connections (DK1, DK2) are provided to connect two different metallization layers. The minimum interval b between the inter-layer connections in the topmost dielectric layer is selected to be less than or equal to ($b \leq c$) the minimum interval c between the inter-layer connections in the deeper layers.

The interval a between at least two of the named external contacts is smaller than the minimum interval b or c between the inter-layer connections in the dielectric layers.

On the surface of the component is a protective layer, which lies on top of the chip and is designed to protect the chip against environmental influences. Another task of the protective layer is to prevent the liquid casting compound of another covering that needs to be applied later from running under the chip and touching the active IC circuitry, which would result in malfunctions, in particular detuning or failure of the chip.

The component according to the present invention has at least one high frequency or extremely high frequency connection (HF connection) between electric conductor lines, selected from the external contacts of the at least one chip and/or structure of the named metallization layers, which is provided in a metallization layer of the multilayer substrate. The high frequency or extremely high frequency connection includes at least two conductor lines which are not electrically connected with each other, and is positioned in one or more metallization layers in the multilayer substrate. The high frequency or extremely high frequency connection exhibits fanning of the conductor lines in at least one metallization layer. It is possible either for at least a part of the HF connections and DC connections to be positioned on the top or bottom of the substrate, or for all the signal lines to be hidden in the substrate. The fanning of the conductor lines according to the invention may be provided in the topmost metallization layer below the chip area, or else between the dielectric layers.

The HF connection may for example connect at least two external contacts of the same chip. Furthermore, it is also possible for the HF connection to connect at least one external contact of the chip and at least one external contact of another chip that is positioned on top of the multilayer substrate. It is also possible for the HF connection to connect at least one metal structure which is positioned in one of the metallization layers in the multilayer substrate with at least one external contact of the chip, or with another metal structure that is positioned in one of the metallization layers in the multilayer substrate.

If the interval between at least two external contacts of the chip is equal to or greater than the requisite minimum interval b, the named external contacts preferably lie directly above inter-layer connections located in the topmost dielectric layer.

A chip may contain active or passive components. A chip may also be an encased component.

The chip may be a microwave chip, a millimeter wave chip or an IC component (IC=integrated circuit). The IC component may be in particular a MMIC component (MMIC=monolithic microwave integrated circuit).

The active chip components may be constructed for example on the basis of Si, SiGe, GaAs or InP.

Furthermore, the component according to the invention may contain a discrete component, selected from a capacitor, a coil, a resistor or a chip component, which contains at least a part of the following circuitry: an RLC circuit, a filter, a switch, a directional coupler, a bias network, an antenna, an impedance converter or a matching network.

The chip has one side with metal structures. These metal structures represent in particular at least two external contacts for electrical connection with the metal structures hidden in the substrate.

The chip is preferably mechanically and electrically connected with the substrate and the integrated circuit elements by means of the flip-chip technique, with the structured (and possibly surface-sensitive) side of the chip facing the top side of the substrate.

In addition to the chip there may be one or more support substrates having passive HF structures such as filters or mixers, in particular support substrates structured using thin film technology, positioned on the top of the substrate.

The term substrate is used here to mean all types of planar circuit carriers. These include ceramic substrates (thin film ceramics, thick film ceramics, LTCC=low-temperature cofired ceramics, HTCC=high-temperature cofired ceramics; LTCCs and HTCCs are ceramic multilayer circuits), polymer substrates (conventional circuit boards such as FR4, so-called soft substrates whose polymer base consists for example of PTFE≈Teflon or polyolefins and which are typically reinforced with fiberglass or filled with ceramic powder), or silicon.

In preferred embodiments of the invention the substrate contains integrated circuit elements. The term circuit element means in particular an inductance, a capacitance, a connecting line or a delay line, which together may realize for example a resonator, a filter circuit or a directional coupler. These may be arranged in a known manner as conductor lines between, in and on the dielectric layers of a substrate having multilayer construction, and thus form integrated circuit elements. Vertical connections between the conductor lines in various layers (inter-layer connections) are also counted as integrated circuit elements, since on the one hand they serve to conduct signals vertically, and on the other hand, in particular at extremely high frequencies, they constitute both a (parasitic) inductance and a (parasitic) capacitance. A plurality of individual integrated circuit elements together form integrated circuits, in particular passive circuits such as that of a filter or a mixer. In addition, integrated circuit elements may realize at least a part of at least one active circuit which is electrically connected to active individual components on the surface of the substrate.

The bottom side of the substrate has external contacts for electrical connection, for example to the circuit board of a terminal device.

Metallization layers are located primarily between the dielectric substrate layers. The top side and bottom side of the substrate, which likewise have metal structures, are also regarded as metallization layers here.

The top side of the substrate supports at least two conductor lines (metallizations), each of which constitutes in particular a contact for producing electrical connection between the metallization layers in the substrate and the chip on the top of the substrate. Here the interval between the named contacts according to the invention is smaller than that between the corresponding inter-layer connection in the topmost dielectric layer of the substrate, in order to enable connection of a chip having an interval between the external electrodes which is less than the prescribed minimum interval between the inter-layer connections in the topmost layer of the substrate (e.g., 225 μm for ceramic substrates). Such "fanned-out" HF connections must be kept especially short, in order to prevent influencing or damping of the signal when the component is encapsulated, in particular in the extremely high frequency range.

The metallization layers in the interior of the substrate contain at least two conductor lines, each of which connects in particular one of the inter-layer connections located in the underlying dielectric layer to one of the inter-layer connections located in an overlying dielectric layer. Here the interval between the interface connections in the top dielectric layer according to the invention is chosen to be smaller than that in the underlying dielectric layer, in particular in order to maintain the prescribed minimum interval in the latter layer (e.g., 350 μm for ceramic substrates).

The contacting of the chip on a module substrate according to the invention, or the contacting of the signal lines in various metallization layers in a (multi-layer) module substrate according to the invention, is distinguished compared to the existing art by low electrical losses in the extremely high frequency range, in particular the millimeter wave range. Compared to the usual contacting techniques, the contacting according to the present invention has the advantage that it is especially space-saving and thereby enables an especially high degree of integration in an extremely high frequency module. While known extremely high frequency modules must forego encapsulation (with a casting compound) because of high losses, the contacting according to the present invention enables encapsulation of the extremely high frequency modules.

The invention will be explained in greater detail below on the basis of exemplary embodiments and the corresponding schematic (and therefore not true-to-scale) figures.

DETAILED DESCRIPTION

Figure 2:
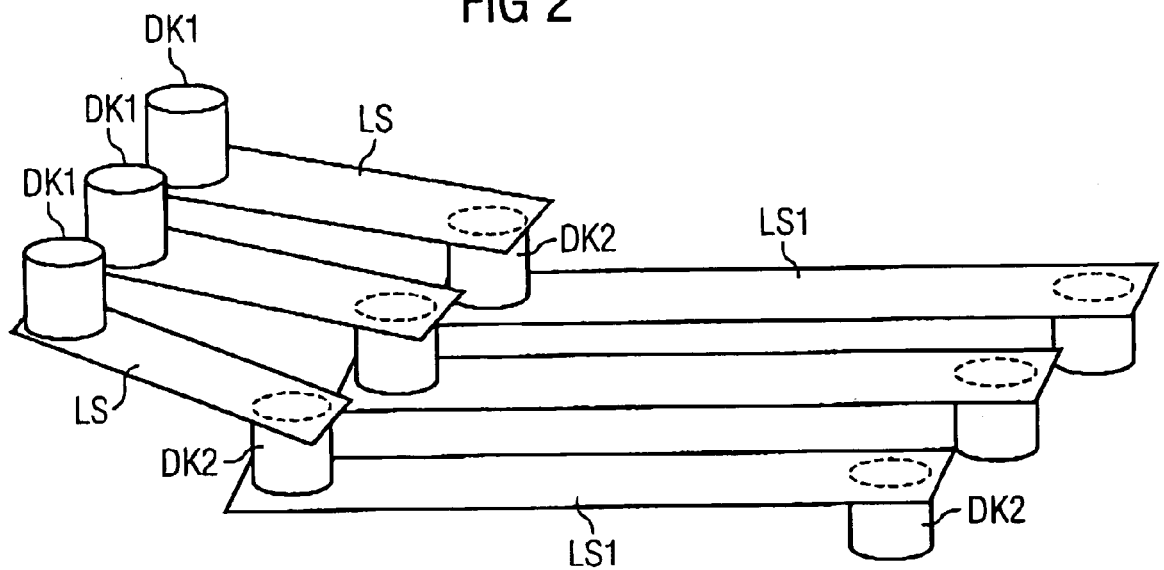
FIG. 2 shows a perspective view of an HF connection according to the invention, in a metallization layer in the interior of the substrate

In FIG. 2, general features of the invention are explained on the basis of a perspective view of the metallization layers of a component according to the invention.

Figure 1:
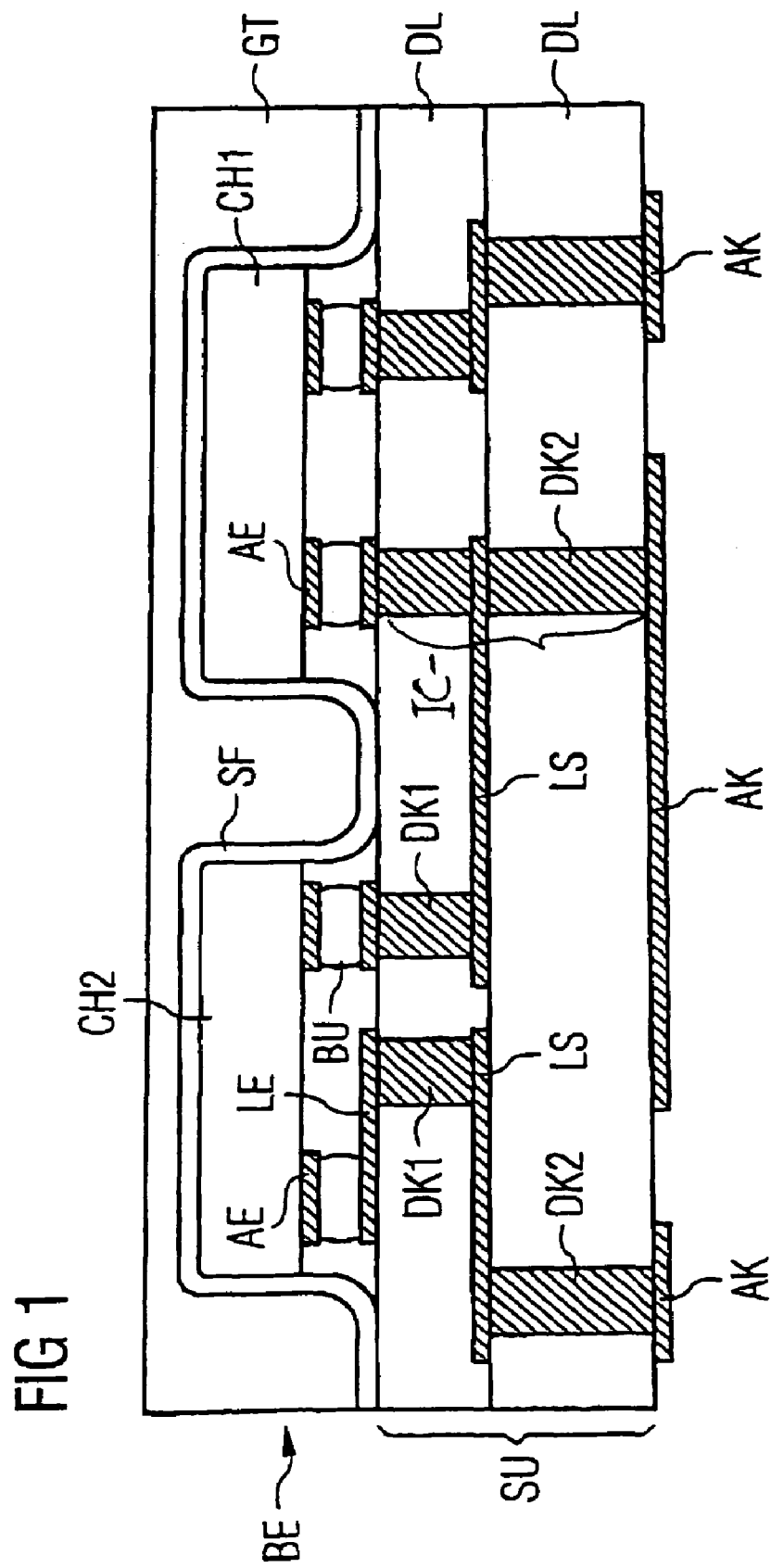
FIG. 1 shows a schematic cross section of a component according to the invention

FIG. 1 shows the schematic cross section of a component BE according to the invention, having two chips CH1, CH2 positioned on a multilayer substrate SU.

The HF connections in the component according to the invention are realized by conductor lines LE (on the top of the substrate) or LS (in the interior of the substrate). The conductor lines LS may also form integrated circuit elements, such as a passive circuit element IC, which can. e.g., include a capacitor or a resistor. The vertical signal feedthrough in the substrate SU is accomplished by means of inter-layer connections DK1 and DK2.

If the smallest interval between two external electrodes is equal to or less than the minimum interval between the inter-layer connections DK1 in the topmost layer of the substrate, then the inter-layer connections may be positioned directly under the named external electrodes, as indicated for example for chip CH1. If the smallest interval between adjacent external electrodes is less than the minimum interval between the inter-layer connections DK1 in the topmost layer of the substrate, it is necessary to fan out the conductor lines that realize HF connections. The spreading of the HF connections on the top of the substrate preferably takes place beneath the chip area. General features of the HF connections according to the invention are explained in FIG. 2.

The chips may include active and/or passive circuit elements (in particular an inductance, a capacitor, a resistor, a diode or a transistor), or complete passive circuits (for example filters, mixers, a matching network). Moreover the possibility also exists of installing passive discrete components, in particular coils, capacitors or resistors on the top of the substrate. It is possible for example, using additional discrete passive compensation structures, to compensate for the detuning of the component caused by the housing.

The chips CH1, CH2 each have external electrodes AE, and are electrically connected here by means of bumps BU to HF conductors LE or LS arranged on the substrate surface and hidden within the substrate SU. The bumps BU serve to produce an electrical connection between the HF connections or conductor lines LS hidden in the substrate and the chips CH1 and CH2, and possibly the other electronic components located on the top of the substrate. For the extremely high frequency applications the height of the bumps must be kept low enough so that only a small quantity of the electromagnetic radiation emerging from the chip can be absorbed by the protective layer. One possibility for achieving the low height of the flip-chip bumps is offered in particular by thermocompression bonding.

It is possible for the external electrodes AE of the chip to be pin-shaped (leads), or to be formed as SMD contacts.

The substrate SU has conductor lines LE to produce the named electrical contact on the top and external contacts AK on the bottom to produce an electrical connection with the circuit board of a terminal device. The external contact AK may be designed as land grid arrays (LGAs), or may be provided additionally with solder balls (μBGAs, or ball grid arrays). Also possible are pin-shaped external contacts (leads) and non-galvanic transitions between the component and the externally connectable circuit board, for example waveguide transitions or slotted couplings.

In the preferred exemplary embodiment of the invention shown in FIG. 1, the chips CH1, CH2 are covered with a protective layer SF for protection against humidity and external mechanical effects. The protective layer is preferably a dielectric layer or film. The chips are covered with the film by means of lamination. In the lamination process the film is permanently deformed. The film covering is preferably made of a polymer that exhibits especially low absorption of water, for example polyimide, fluorine-based polymers such as polytetrafluoroethylene (PTFE) or polyolefins such as (cross-linked) polypropylene or polyethylene. The film covering may also be made of a metal and be filled with fibers or particles. Moreover, the film covering may be or become coated with metal or ceramic.

It is possible for the protective layer SF to completely and jointly cover the chips CH1, CH2 on the top of the component.

For mechanical stabilization, the chips in this exemplary embodiment are covered with a casting compound GT. Optionally it is possible to leave out the casting compound. Casting compound here means all substances that are applied in liquid state to the protective layer and become solid through curing (chemical reaction) or congealing (cooling). If the chip has no signal-conducting structures on its surface that need protection (for example if all of the circuit elements and circuits are hidden in the multilayer substrate SU), it is possible to first cover the chip with the casting compound, and only after the casting compound has cured to apply a protective layer or film covering.

The chips CH1, CH2 and the conductor lines LS may (individually or together) form at least part of the following circuits: a high-frequency switch, a matching circuit, an antenna, an antenna switch, a diode switch, a high-pass filter, a low-pass filter, a band-pass filter, a band-stop filter, a power amplifier, a diplexer, a duplexer, a coupler, a directional coupler, a storage element, a balun or a mixer.

The HF signal lines in the component according to the present invention may either be entirely hidden in the substrate, or at least part of the signal line may be located on the top of the substrate.

FIG. 2 shows a schematic perspective top view of an HF line with the fanning according to the present invention in the interior of the substrate.

The interval between the inter-layer connections DK1 (for example a maximum of 340 μm) in the top dielectric layer of the substrate is smaller than the interval between the inter-layer connections DK2 in the underlying layer of the substrate (for example at least 350 μm). The connection between the corresponding inter-layer connections is made in each case by means of fanned-out conductor lines LS, which provide contact points for the inter-layer connectors to make contact. In this case the conductor lines LS1 of a metallizing level that is located in a deeper-lying layer of the substrate form a triplate line.

Figure 3:
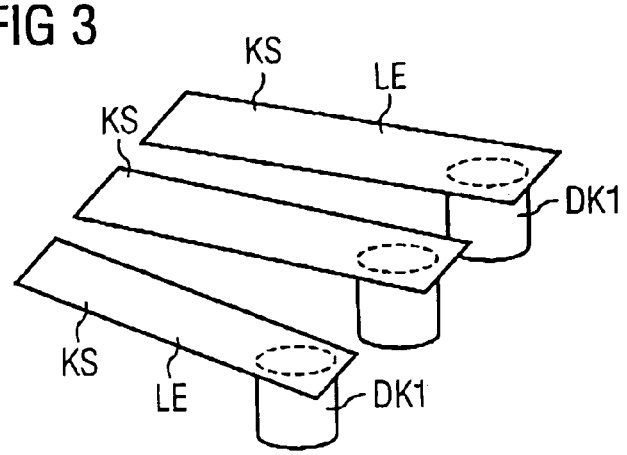
FIG. 3 shows a perspective view of an HF connection according to the invention on the surface of the substrate.

FIG. 3 shows the contacting technique according to the present invention on the top of the substrate. With the help of the spread-out HF connections formed by the conductor lines LE, the contact points KS for contacting the chip may be made available at a smaller interval (for example less than 220 μm) than the prescribed minimum interval between the inter-layer connections DK1 in the top-most layer of the substrate (e.g., 225 μm). If a greater minimum interval is necessary between the inter-layer connections in the underlying layers of the substrate (e.g., 350 μm), the HF connections in the corresponding metallization layer may be spread wider, for example from 225 μm to 350 μm.

Depending-on the number of conductor lines in the metallization layers, a component having contacting according to the present invention may contain a microstrip line, or in some cases a "suspended microstrip" (the counterpart to a microstrip line, but which is not located on top of the substrate but in the interior of the substrate), a two-wire line, a three-wire line or triplate line, each of which runs for example in at least two metallization layers. Here parts of the named lines are electrically connected to each other by means of inter-layer connections that are located above or below the corresponding metallization layers.

As indicated in FIG. 2, one HF line (for example the microstrip line, the two-wire line, the three-wire line or the triplate line) may run in at least two parallel metallization layers, with the vertical electrical connection between the parts of the HF line that lie in the different metallization layers being accomplished by means of an inter-layer connection.

In the interest of clarity, the invention has been presented on the basis of only a few exemplary embodiments; but it is not restricted to these. Additional possibilities are available in regard to the technique of connection between the individual component and the substrate and between the substrate and an external circuit board.

The invention claimed is:

1. A high frequency module comprising:
   a substrate having multiple layers, the substrate comprising:
      metallization layers comprising conductor lines; and
      dielectric layers comprising inter-layer connections for connecting metallization layers;
      the metallization layers being located among the dielectric layers, on an upper surface of the substrate, and on a bottom surface of the substrate;
      wherein a first interval between inter-layer connections in a top-most dielectric layer is equal to or smaller than a second interval between inter-layer connections in other dielectric layers;
   a chip on the substrate, the chip having external contacts to electrically connect the chip to the metallization layer on the upper surface of the substrate, wherein a third interval between the external contacts of the chip is smaller than the first or second intervals;
   a high frequency connection between the chip and the metallization layer on the bottom surface of the substrate, the high frequency connection having at least two conductor lines that are not electrically connected to each other and that are located in one or more metallization layers of the substrate; and
   a passive circuit element integrated into the substrate, the passive circuit element comprising a resonator, a directional coupler, or a filter;
   wherein in at least one metallization layer of the substrate, the conductor lines of the at least one metallization layer are of fixed-width and a distance between the conductor lines of the at least one metallization layer varies.

2. The module of claim 1, further comprising:
   a film for covering the chip.

3. The module of claim 2, wherein the film comprises a dielectric layer.

4. The module of claim 1, further comprising:
   a casting compound for encapsulating the module.

5. The module of claim 1, wherein the high frequency connection is located on a surface of the substrate below the chip.

6. The module of claim 1, wherein the high frequency connection is between the dielectric layers.

7. The module of claim 1, wherein the high frequency connection connects the external contacts of the chip with the metallization layer on the bottom surface of the substrate.

8. The module of claim 1, further comprising a further chip on the substrate, the high frequency connection connecting at least one external contact of the chip and at least one external contact of the further chip with the metallization layer on the bottom surface of the substrate.

9. The module of claim 1, wherein the high frequency connection connects a first metal structure in one of the metallization layers of the substrate with at least one external contact of a chip or with another metal structure.

10. The module of claim 1, wherein the high frequency connection comprises a fanned-out high frequency connection.

11. The module of claim 10, wherein the fanned-out high frequency connection is located in the metallization layer on the upper surface of the substrate below the chip.

12. The module of claim 10, wherein the fanned-out high frequency connection is located among the dielectric layers.

13. The module of claim 1, wherein the third interval is equal to or larger than the second interval; and
   wherein at least one of the external contacts is arranged directly on top of one of the inter-layer connections.

14. The module of claim 1, wherein an inter-layer connection comprises an inductive element, a capacitive element, a connecting line, or a delay line.

15. The module of claim 1, wherein the high frequency connection comprises a microstrip line, a two-wire line, or a three-wire line.

16. The module of claim 1, wherein the high frequency connection is between dielectric layers of the substrate and forms at least one part of a triplate line.

17. The module of claim 1, wherein at least one inter-layer connection provides an electrical connection between segments of the high frequency connection that are located in different metallization layers.

18. The module of claim 1, wherein the chip comprises one or more of the following: a diode and a transistor.

19. The module of claim 1, wherein the chip comprises a microwave chip, a millimeter wave chip, or an integrated circuit component.

20. The module of claim 1, wherein the chip is mechanically and electrically connected to the substrate via a flip-chip technique or a surface mounted device technique.

21. The module of claim 1, wherein the substrate comprises at least two dielectric layers formed by low-temperature cofired ceramics or high-temperature cofired ceramics.

22. The module of claim 1, wherein at least two of the conductor lines are of different fixed-widths.

* * * * *